United States Patent
Hsieh

(10) Patent No.: US 11,522,166 B2
(45) Date of Patent: Dec. 6, 2022

(54) DISPLAY PANEL AND ELECTRONIC DEVICE INCLUDING LINEAR POLARIZER BETWEEN QUARTER WAVE PLATES

(71) Applicant: BOE TECHNOLOGY GROUP CO., LTD., Beijing (CN)

(72) Inventor: Mingche Hsieh, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/269,416

(22) PCT Filed: May 28, 2020

(86) PCT No.: PCT/CN2020/092970
§ 371 (c)(1),
(2) Date: Feb. 18, 2021

(87) PCT Pub. No.: WO2020/239037
PCT Pub. Date: Dec. 3, 2020

(65) Prior Publication Data
US 2021/0193970 A1     Jun. 24, 2021

(30) Foreign Application Priority Data

May 31, 2019  (CN) .......................... 201910475294.6

(51) Int. Cl.
*H01L 51/52*    (2006.01)
(52) U.S. Cl.
CPC ................... *H01L 51/5281* (2013.01)

(58) Field of Classification Search
CPC combination set(s) only.
See application file for complete search history.

(56) References Cited

U.S. PATENT DOCUMENTS

| 10,387,712 B2 | 8/2019 | Zeng et al. |
| 2009/0185108 A1* | 7/2009 | Park ...................... G02B 5/0294 |
| | | 359/485.06 |
| 2010/0127238 A1 | 5/2010 | Kim et al. |
| 2012/0026585 A1 | 2/2012 | Nam et al. |
| 2012/0267646 A1 | 10/2012 | Kim |
| 2016/0266296 A1* | 9/2016 | Son ...................... H01L 51/5237 |

(Continued)

FOREIGN PATENT DOCUMENTS

| CN | 102890362 A | 1/2013 |
| CN | 107092892 A | 8/2017 |

(Continued)

OTHER PUBLICATIONS

First Chinese Office Action dated Jan. 5, 2021, received for corresponding Chinese application No. 201910475294.6, ten pages.

(Continued)

*Primary Examiner* — Daniel Whalen
(74) *Attorney, Agent, or Firm* — Kinney & Lange, P.A.

(57) ABSTRACT

Embodiments of the present disclosure provide a display panel and an electronic device. The display panel includes: a back plate; a light emitting element on a side of the back plate; a circular polarizer on a side of the light emitting element away from the back plate; a wave plate on a side of the polarizer away from the back plate; and an anti-glare film layer on a side of the wave plate away from the back plate.

13 Claims, 2 Drawing Sheets

(56) References Cited

U.S. PATENT DOCUMENTS

| | | | |
|---|---|---|---|
| 2017/0125743 A1* | 5/2017 | Kim | G02B 5/3016 |
| 2021/0028406 A1* | 1/2021 | Sun | H01L 27/3234 |
| 2021/0193970 A1 | 6/2021 | Hsieh | |
| 2021/0257596 A1* | 8/2021 | Tang | H01L 51/5246 |

FOREIGN PATENT DOCUMENTS

| | | |
|---|---|---|
| CN | 107316948 A | 11/2017 |
| CN | 207529935 U | 6/2018 |
| CN | 108962970 A | 12/2018 |
| CN | 109542273 A | 3/2019 |
| CN | 208738254 U | 4/2019 |
| CN | 110161699 A | 8/2019 |
| CN | 110208957 A | 9/2019 |

OTHER PUBLICATIONS

Second Chinese Office Action dated Aug. 5, 2021, received for corresponding Chinese application No. 201910475294.6, seven pages.

* cited by examiner

DISPLAY PANEL AND ELECTRONIC DEVICE INCLUDING LINEAR POLARIZER BETWEEN QUARTER WAVE PLATES

CROSS-REFERENCE TO RELATED APPLICATION

This application is a Section 371 National Stage Application of International Application No. PCT/CN2020/092970, filed on May 28, 2020, entitled "DISPLAY PANEL AND ELECTRONIC DEVICE" which claims priority to Chinese Application No. 201910475294.6 filed on May 31, 2019, the disclosure of which is incorporated herein by reference in entirety.

TECHNICAL FIELD

The present disclosure generally relates to the field of display technology, and in particular, to a display panel and an electronic device.

BACKGROUND

With the advancement of technology, screen-to-body ratios of electronic devices are increasing. The position of the camera/sensor and other components is changed from being set outside the range of the display screen to being set within the range of the display screen. Finally, it is hoped to achieve full-screen display, and the setting of the camera/sensor and other components should not affect the full-screen display. One possible way is to place the camera/sensor and other components on the back side of the display screen, which may transmit light and realize normal display. In the process of realizing the full-screen display of a smart electronic device, the following problems are found. The camera/image sensor captures a "phantom" picture when the display panel is illuminated. The "phantom" picture is generated from the light emitted by the pixel unit being reflected to the camera/image sensor, and then captured by the camera/image sensor. The generation of "phantom" picture affects the normal image collection and the imaging of electronic devices such as smart phones.

SUMMARY

According to a first aspect of the present disclosure, a display panel is provided, including: a back plate; a light emitting element on a side of the back plate; a circular polarizer on a side of the light emitting element away from the back plate; a wave plate on a side of the circular polarizer away from the back plate; and an anti-glare film layer on a side of the wave plate away from the back plate.

According to some embodiments of the present disclosure, the circular polarizer includes a first wave plate and a linear polarizer, the wave plate is the second wave plate, the first wave plate is provided on a side of the linear polarizer close to the back plate.

According to some embodiments of the present disclosure, the display panel is an organic light emitting display panel, and the light emitting element is an electroluminescent element.

According to some embodiments of the present disclosure, the display panel further includes an insulating layer, and the light emitting element is covered by the insulating layer.

According to some embodiments of the present disclosure, the display panel further includes an adhesive film layer, and the adhesive film layer is provided between the insulating layer and the circular polarizer.

According to some embodiments of the present disclosure, the display panel further includes a back film, and the back film is provided on a side of the back plate away from the light emitting element.

According to some embodiments of the present disclosure, the first wave plate and the second wave plate are quarter wave plates.

According to some embodiments of the present disclosure, an optical axis of the first wave plate and a polarization vibration direction of the linear polarizer form an angle of 45°.

According to some embodiments of the present disclosure, the linear polarizer is made of polyvinyl alcohol or triacetyl cellulose materials with a thickness of 15-50 µm.

According to some embodiments of the present disclosure, the first wave plate is made of cyclic olefin polymer material with a thickness of 5-15 µm; and/or the second wave plate is made of cyclic olefin polymer material with a thickness of 5-15 µm.

According to some embodiments of the present disclosure, the anti-glare film layer is made of polyethylene terephthalate material with a thickness of 20-100 µm.

According to a second aspect of the present disclosure, an electronic device is provided, including: the organic light emitting display panel according to any one of the above-mentioned embodiments; and an image collector.

According to some embodiments of the present disclosure, the image collector is located on a side of the back plate away from the light emitting element.

According to some embodiments of the present disclosure, the image collector is a camera or an image sensor.

BRIEF DESCRIPTION OF THE DRAWINGS

Other features, purposes and advantages of the present disclosure will become more apparent by the following detailed description to the non-limited embodiments with reference to the drawings.

DETAILED DESCRIPTION OF EMBODIMENTS

Figure 1:
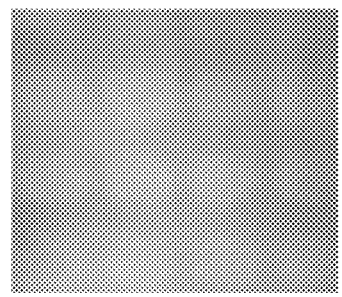
FIG. 1 is an exemplary schematic diagram of the phantom picture.

The present disclosure will be further described in detail below with reference to the drawings and the embodiments. It may be understood that the specific embodiments described here are only used to explain the relevant disclosure, not to limit the present disclosure. In addition, it should be noted that, for ease of description, only parts related to the disclosure are shown in the drawings.

Unless otherwise defined, technical terms or scientific terms used in the present disclosure shall have the common meanings understood by those with ordinary skills in the field to which the present disclosure belongs. "First", "second" and similar words used in the present disclosure do not indicate any order, quantity, or importance, but are only used to distinguish different components. "Include" or "comprise" and other similar words mean that the element or item before the word encompasses the element or item and their equivalents listed after the word, but does not exclude other elements or items. Similar words such as "coupled" or "connected" are not limited to physical or mechanical connections, but may include electrical connections, whether direct or indirect. "Up", "down", "left", "right", etc. are only used to indicate a relative position relationship. When an absolute position of a described object changes, the relative position relationship may also change accordingly.

It should be noted that the embodiments in the present disclosure and features in the embodiments may be combined with each other if there is no conflict. Hereinafter, the present disclosure will be described in detail with reference to the drawings and in conjunction with the embodiments.

FIG. 1 shows that there is a phenomenon of "phantom" picture in a picture taken by a camera of a smart electronic device, which is not expected, it affects a definition of the taken picture, and reduces a shooting effect and a shooting experience. A reason for a generation of the "phantom" picture is that: light emitted by a pixel unit is reflected to a camera/image sensor and then captured by the camera/image sensor.

In view of the above-mentioned defects or shortcomings, the embodiments of the present disclosure are expected to provide a display panel and an electronic device that may prevent the "phantom" picture caused by reflected light of an electroluminescent element.

Figure 2:
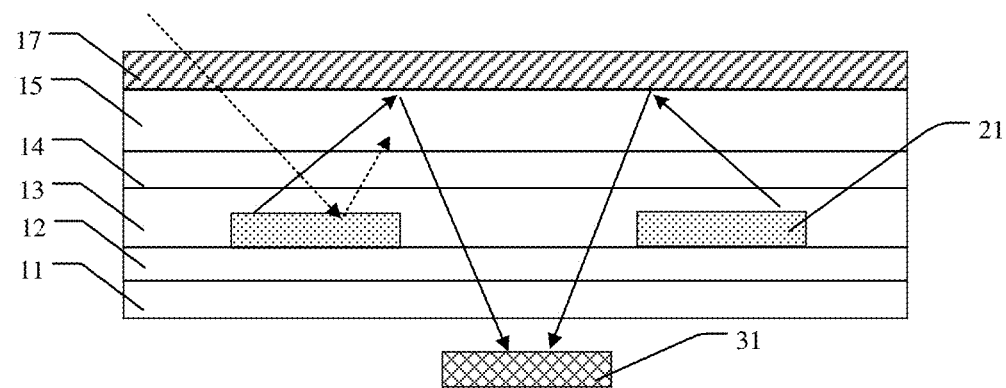
FIG. 2 is an exemplary structural diagram of an organic light emitting display panel.

As shown in FIG. 2, the organic light emitting display panel includes a back film 11, a back plate 12, an electroluminescent element 21, an insulating layer 13, an adhesive film layer 14, a circular polarizer 15 and an anti-glare film layer 17 arranged in sequence. A purpose of arranging the circular polarizer 15 on the insulating layer 13 is to eliminate an interference of external stray light which may cause adverse effects on the normal display. The circular polarizer may be combined of a linear polarizer and a quarter wave plate. An optical axis of the quarter wave plate and a polarization vibration direction of the linear polarizer form an angle of 45°. light incident from one end of the linear polarizer is a forward direction, and the light incident from one end of the quarter wave plate is a reverse direction. Natural light directed to the circular polarizer in the forward direction becomes the circular polarized light after passing through the linear polarizer and the quarter wave plate successively. According to different relative orientations when a polarization direction of the linear polarizer and the optical axis of the quarter wave plate form an angle of 45°, right-handed circular polarized light or left-handed circular polarized light may be generated; the light directed to the circular polarizer in the reverse direction becomes the linear polarized light after being emitted from the quarter wave plate and the linear polarizer.

Exemplarily, the light emitted by the electroluminescent element 21 is converted into the linear polarized light through the circular polarizer 15, and the linear polarized light is reflected by the anti-glare film layer 17 and enters an image collector 31, so that the phantom picture as shown in FIG. 1 is collected in the image collector 31. These phantoms cause anomalies in the collected images.

Figure 3:
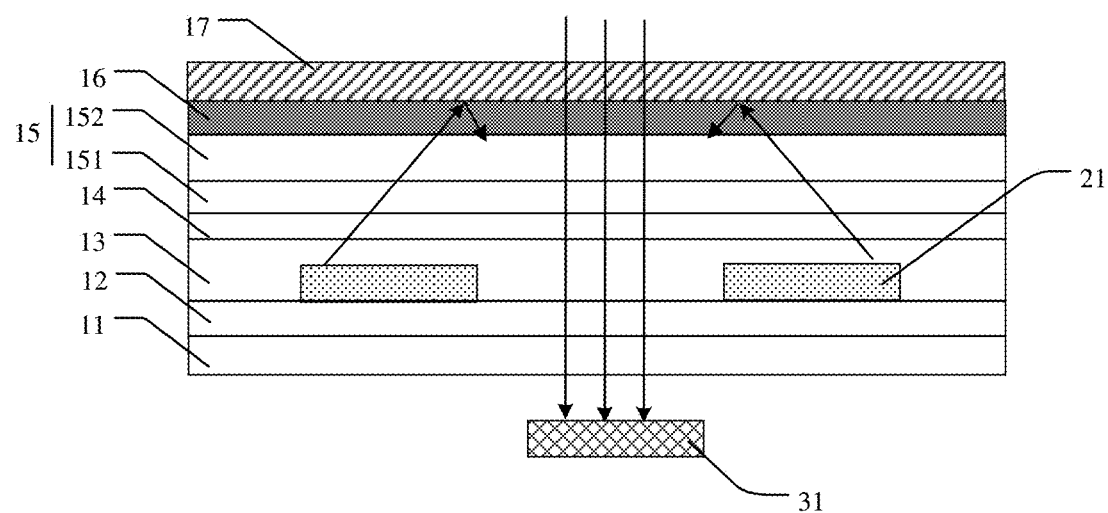
FIG. 3 is an exemplary structural diagram of the organic light emitting display panel according to the embodiments of the present disclosure.

In order to solve the above problem, the embodiments of the present disclosure propose an organic light emitting display panel as shown in FIG. 3. The organic light emitting display panel includes a back film 11, a back plate 12, an electroluminescent element 21, an insulating layer 13, an adhesive film layer 14, a circular polarizer 15, and an anti-glare film layer 17 arranged in sequence, and also includes a second wave plate 16 on the circular polarizer 15.

The circular polarizer 15 includes a linear polarizer 152 and a first wave plate 151, and the first wave plate 151 is located on a side of the linear polarizer 152 away from the second wave plate 16. The second wave plate 16 is a quarter wave plate.

Here, the back film 11 may be made of PET (polyethylene terephthalate) material with a thickness of 15-100 μm; the back plate 12 may be made of polyimide material with a thickness of 5-25 μm, and the back plate 12 may be used as a TFT back plate; the electroluminescent element 21 may be various organic/inorganic materials, with a thickness of 5-20 μm; the linear polarizer 152 may be made of PVA (polyvinyl alcohol) or TAC (triacetyl cellulose) materials, with a thickness of 15-50 μm; the first wave plate 151 and the second wave plate 16 may be made of COP (cyclic olefin polymer) material with a thickness of 5-15 μm; the anti-glare film layer 17 may be made of PET (polyethylene terephthalate) material with a thickness of 20-100 μm. The organic light emitting display panel reflects a part of the natural light when external ambient light is irradiated strongly, which interferes with the light emitted by the display screen itself. When an intensity of the external light reflected by the display screen is greater than an intensity of the light displayed on the display screen itself, a contrast of the display screen is low and a display effect is decreased. Therefore, reducing the interference of the ambient reflected light greatly improves a display effect of the display panel under strong light. Therefore, the circular polarizer 15 is usually arranged on the insulating layer 13 to eliminate the adverse effects of the reflection of the external light on the display of the organic light emitting display panel. At this time, the external ambient light is converted into, for example, the left-handed circular polarized light through the circular polarizer 15, the left-handed circular polarized light is converted into the right-handed circular polarized light through the reflection of a metal electrode in an electroluminescent element layer, and the right-handed circular polarized light further becomes a vertical polarized light through the first wave plate 151 (a part of the circular polarizer 15), which may not pass through the linear polarizer 152, thereby eliminating the interference of the external light. Refer to a dashed part in FIG. 2, which indicates that the external ambient light enters the organic light emitting display panel from the outside, being converted into the left-handed circular polarized light through the circular polarizer 15 and irradiated on the electroluminescent element 21, and then being converted into the right-handed circular polarized light through the reflection of the metal electrode in the electroluminescent element 21. Due to the existence of the first wave plate in the circular polarizer 15, the right-handed circular polarized light becomes the vertical polarized light through the first wave plate 151 of the circular polarizer 15 (in the same position as the first wave plate 151 in FIG. 3), and may not pass through the linear polarizer 152, and therefore may not be emitted from the display screen, which may eliminate the interference of the external light. It should be noted that in practical applications, the external ambient light will be refracted when it passes through the anti-glare film layer 17. The drawing shows a general direction of the light path in a simplified manner, and does not reflect the characteristics of refraction, but it does not mean that no refraction phenomenon is occurred.

When the organic light emitting display panel with only the circular polarizer is applied to a full screen, it may not solve the problem of the "phantom" being collected by the image collecting device. Therefore, the second wave plate 16 is arranged on the linear polarizer 152 to prevent "the generation of phantom". Specifically, after the second wave plate 16 is arranged, the light emitted by the electroluminescent element forms the linear polarized light through the linear polarizer 152, the linear polarized light forms the left-handed circular polarized light through the second wave plate 16, and the left-handed circular polarized light is converted into the right-handed circular polarized light through the reflection of the anti-glare film layer. The right-handed circular polarized light is further converted into the vertical polarized light through the second wave plate 16, so it may not pass through the first wave plate 151, thereby eliminating the "phantom" picture.

A light path of the light emitted by the electroluminescent device in FIG. 3 is described above, and a light path of the light emitted from external environment on the organic light emitting display panel is described below in conjunction with FIG. 3. The external ambient light forms the linear polarized light through the second wave plate 16 and the linear polarizer 152. The linear polarized light forms, for example, the left-handed circular polarized light through the first wave plate 151, and the left-handed circular polarized light is converted into the right-handed circular polarized light through the reflection of the metal electrode in the electroluminescent element layer, and the right-handed circular polarized light is further converted into the vertical polarized light through the first wave plate 151, and may not pass through the linear polarizer 152, thereby eliminating the interference of the external light.

In addition, the above-mentioned setting of the second wave plate 16 does not affect the normal image collection of the image collector 31. As shown in FIG. 3, the incident light perpendicular to the organic light emitting display panel may pass through the image collector 31, so that the image collector 31 captures normal picture information without phantoms.

Figure 4:
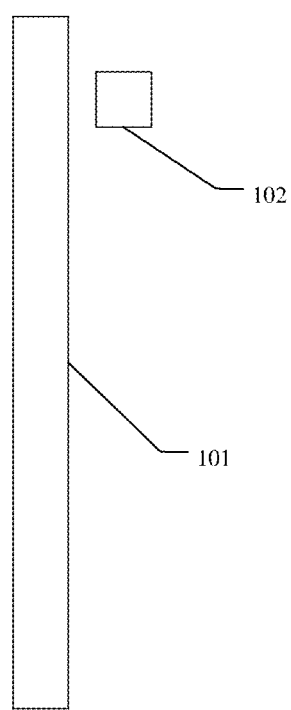
FIG. 4 is an exemplary structural diagram of an electronic device according to the embodiments of the present disclosure.

As shown in FIG. 4, the embodiments of the present disclosure further provide an electronic device, including the organic light emitting display panel 101 and the image collector 102 provided by the embodiments of the present disclosure, the image collector 102 is located on a side of the back film away from the electroluminescent element 101. That is, the image collector 102 is arranged on a back side of the display panel 101, so that it may take pictures and the display effect is not affected. Specifically, the electronic device may be a full-screen displayed smart phone, or an electronic device that is full-screen displayed and may take pictures, for example, a tablet computer, a portable computer, etc.

Further, the image collector is a camera or an image sensor, such as a CCD (Charged Coupled Device) image sensor or a CMOS (Complementary Metal-Oxide Semiconductor) image sensor.

According to the technical solution provided by the embodiments of the present disclosure, by providing the wave plate on the circular polarizer, the problem that the "phantom" picture caused by the reflected light of the electroluminescent may be solved.

The above description is only a preferred embodiment of the present disclosure and an explanation of applied technical principles. Those skilled in the art should understand that the scope of disclosure involved in the present disclosure is not limited to the technical solution formed by the specific combination of the above technical features, and should also cover other technical solutions formed by any combination of the above technical features or its equivalent features without departing from the inventive concept. For example, the technical solution formed by mutually replacing the above-mentioned features with the technical features disclosed in the present disclosure (but not limited to) with similar functions.

What is claimed is:

1. A display panel, comprising:
   a back plate;
   a light emitting element on a first side of the back plate;
   a circular polarizer on a side of the light emitting element away from the back plate,
   the circular polarizer comprising a first wave plate and a linear polarizer;
   a second wave plate on a side of the circular polarizer away from the back plate; and
   an anti-glare film layer on a side of the wave plate away from the back plate;
   wherein the first wave plate is provided on a side of the linear polarizer close to the back plate;
   wherein the display panel further comprises an insulating layer, and the light emitting element is covered by the insulating layer;
   wherein the display panel further comprises an adhesive film layer, and the adhesive film layer is provided between the insulating layer and the circular polarizer; and
   wherein the first wave plate is directly provided on the adhesive film layer, so that the adhesive film layer is located between the first wave plate and the insulating layer and is in direct contact with the first wave plate and the insulating layer.

2. The display panel according to claim 1, wherein,
   the display panel is an organic light emitting display panel, and the light emitting element is an electroluminescent element.

3. The display panel according to claim 2, wherein,
   the display panel further comprises a back film, and the back film is provided on a second side of the back plate away from the light emitting element.

4. The display panel according to claim 2, wherein,
   the anti-glare film layer is made of polyethylene terephthalate material with a thickness of 20-100 µm.

5. The display panel according to claim 1, wherein,
   the display panel further comprises a back film, and the back film is provided on a second side of the back plate away from the light emitting element.

6. The display panel according to claim 1, wherein,
   the first wave plate and the second wave plate are quarter wave plates.

7. The display panel according to claim 6, wherein,
   an optical axis of the first wave plate and a polarization vibration direction of the linear polarizer form an angle of 45°.

8. The display panel according to claim 1, wherein,
   the linear polarizer is made of polyvinyl alcohol or triacetyl cellulose materials with a thickness of 15-50 µm.

9. The display panel according to claim 1, wherein,
   the first wave plate is made of cyclic olefin polymer material with a thickness of 5-15 µm; and/or
   the second wave plate is made of cyclic olefin polymer material with a thickness of 5-15 µm.

10. The display panel according to claim 1, wherein,
    the anti-glare film layer is made of polyethylene terephthalate material with a thickness of 20-100 µm.

11. An electronic device, comprising:
the display panel according to claim 1; and
an image collector.

12. The electronic device according to claim 11, wherein,
the image collector is located on a second side of the back plate away from the light emitting element.

13. The electronic device according to claim 11, wherein,
the image collector is a camera or an image sensor.

* * * * *